(12) United States Patent
Sri Gopala Krishna Murthi et al.

(10) Patent No.: US 11,081,879 B2
(45) Date of Patent: Aug. 3, 2021

(54) DIRECT CURRENT DISTANCE PROTECTION CONTROLLERS

(71) Applicant: General Electric Technology GmbH, Baden (CH)

(72) Inventors: Sankara Sri Gopala Krishna Murthi, Stafford (GB); Hengxu Ha, Stafford (GB)

(73) Assignee: General Electric Technology GmbH, Baden (CH)

( * ) Notice: Subject to any disclaimer, the term of this patent is extended or adjusted under 35 U.S.C. 154(b) by 352 days.

(21) Appl. No.: 15/766,555

(22) PCT Filed: Sep. 29, 2016

(86) PCT No.: PCT/EP2016/073305
§ 371 (c)(1),
(2) Date: Apr. 6, 2018

(87) PCT Pub. No.: WO2017/060155
PCT Pub. Date: Apr. 13, 2017

(65) Prior Publication Data
US 2018/0301895 A1    Oct. 18, 2018

(30) Foreign Application Priority Data

Oct. 6, 2015    (EP) .................... 15275208

(51) Int. Cl.
*H02H 7/26*   (2006.01)
*H02H 3/38*   (2006.01)
(Continued)

(52) U.S. Cl.
CPC .......... *H02H 7/268* (2013.01); *G01R 31/081* (2013.01); *H02H 3/38* (2013.01); *H02H 1/0053* (2013.01); *H02H 3/05* (2013.01); *H02H 7/265* (2013.01)

(58) Field of Classification Search
CPC ...... H02H 1/0007; H02H 1/0053; H02H 3/05; H02H 3/38; H02H 3/385; H02H 7/26;
(Continued)

(56) References Cited

U.S. PATENT DOCUMENTS 4,559,491 A * 12/1985 Saha ................. H02H 7/26
                                                  324/522
4,812,995 A    3/1989 Girgis et al.
(Continued)

FOREIGN PATENT DOCUMENTS

CN    102985836 A    3/2013
JP    S55-144727 A   11/1980
(Continued)

OTHER PUBLICATIONS

Extended European Search Report issued in connection with corresponding EP Application No. 15275208.5 dated Mar. 29, 2016, 6 pages.
(Continued)

*Primary Examiner* — Fred E Finch, III
(74) *Attorney, Agent, or Firm* — Eversheds Sutherland (US) LLP (57) ABSTRACT

A DC distance protection controller for identifying a fault within a protection zone that extends between a first terminal and a set point along a DC power transmission conduit which lies between the first terminal and a second terminal within a DC electrical power network. The protection controller periodically obtains as respective sampled pairs a measured voltage value and a measured current value of the DC power transmission conduit; isolates a fault component voltage value and a fault component current value to define a respective corresponding isolated pair; calculates from each isolated pair a fault component operating voltage of the DC power transmission conduit at the set point; compare a (Continued)

given calculated fault component operating voltage with a historical voltage value; and identifies a fault within the protection zone when the given calculated fault component operating voltage is greater than the historical voltage value.

9 Claims, 4 Drawing Sheets (51) Int. Cl.
    *G01R 31/08* (2020.01)
    *H02H 1/00* (2006.01)
    *H02H 3/05* (2006.01)

(58) Field of Classification Search
    CPC ...... H02H 7/265; H02H 7/268; G01R 31/081; G01R 31/083; G01R 31/085
    See application file for complete search history.

(56) References Cited

U.S. PATENT DOCUMENTS

| | | | | |
|---|---|---|---|---|
| 5,453,903 | A * | 9/1995 | Chow | H02H 3/40 361/79 |
| 5,493,228 | A * | 2/1996 | Eriksson | H02H 7/26 324/111 |
| 5,773,980 | A * | 6/1998 | Yang | G01R 31/088 324/522 |
| 2005/0094335 | A1 | 5/2005 | Schweitzer, III et al. | |
| 2006/0097728 | A1 * | 5/2006 | Saha | H02H 3/385 324/525 |
| 2012/0200966 | A1 * | 8/2012 | Hill | H02H 7/268 361/62 |
| 2013/0088802 | A1 * | 4/2013 | Berggren | H02H 3/42 361/65 |
| 2013/0096854 | A1 * | 4/2013 | Schweitzer, III | G01R 31/085 702/59 |
| 2013/0107405 | A1 * | 5/2013 | Blumschein | H02H 1/0092 361/79 |
| 2016/0352091 | A1 * | 12/2016 | Qi | H02H 7/268 |
| 2018/0145505 | A1 * | 5/2018 | Li | G01R 23/167 |
| 2018/0294644 | A1 * | 10/2018 | Ha | H02H 7/265 |
| 2018/0301894 | A1 * | 10/2018 | Ha | H02H 1/0007 |
| 2019/0072603 | A1 * | 3/2019 | Liu | G01R 31/085 |
| 2019/0094292 | A1 * | 3/2019 | Schweitzer, III | H02H 1/0007 |
| 2019/0271730 | A1 * | 9/2019 | Liu | H02H 3/165 |

FOREIGN PATENT DOCUMENTS

| | | | |
|---|---|---|---|
| JP | S60-162967 A | 8/1985 | |
| JP | H04-217816 A | 8/1992 | |
| JP | H10-201079 A | 7/1998 | |
| WO | WO-9963641 A1 * | 12/1999 | ................ H02J 3/36 |

OTHER PUBLICATIONS

International Search Report and Written Opinion issued in connection with corresponding PCT Application No. PCT/EP2016/073305 dated Feb. 1, 2017, 8 pages.

International Preliminary Report on Patentability issued in connection with corresponding PCT Application No. PCT/EP2016/073305 dated Apr. 10, 2018, 6 pages.

Machine translation and first Office action and search issued in connection with corresponding CN Application No. 201680058468.3 on Nov. 6, 2018, 13 pages.

* cited by examiner

DIRECT CURRENT DISTANCE PROTECTION CONTROLLERS

FIELD OF INVENTION

This invention relates to a direct current (DC) distance protection controller and a DC electrical power network including at least one such controller.

BACKGROUND

DC electrical power networks, such as DC grids, typically include a plurality of terminals each of which may be operatively associated with a power converter to interconnect the DC power transmission network with a respective alternating current (AC) network.

Respective pairs of terminals are interconnected by a DC power transmission conduit, such as a transmission line or cable. Protection devices, such as circuit breakers and relays, can be operated by one or more protection controllers in the event of a fault so as to protect the DC electrical power network.

BRIEF SUMMARY

According to a first aspect of the invention there is a provided a DC distance protection controller, for identifying a fault within a protection zone extending between a first terminal with which the protection controller is in use operatively associated and a set point along a DC power transmission conduit lying between the first terminal and a second terminal within a DC electrical power network, the protection controller being programmed to:

(i) periodically obtain as respective sampled pairs a measured voltage value and a measured current value of the DC power transmission conduit at the first terminal;

(ii) isolate in respect of each sampled pair, a fault component voltage value from the corresponding measured voltage value and a fault component current value from the corresponding measured current value to define a respective corresponding isolated pair;

(iii) calculate from each isolated pair of fault component voltage and current values a fault component operating voltage of the DC power transmission conduit at the set point along the DC power transmission conduit;

(iv) compare a given calculated fault component operating voltage with a historical voltage value derived from a historical measured voltage value from an earlier sampled pair of measured voltage and current values; and (v) identify a fault within the protection zone when the given calculated fault component operating voltage is greater than the historical voltage value with which it is compared.

The provision of a controller that isolates fault component voltage and current values from respective corresponding measured voltage and current values offers an initial indication of whether a fault has arisen and allows a subsequent assessment of the nature of the fault, i.e. whether the fault has arisen within the protection zone of the associated DC power transmission conduit.

Meanwhile, subsequently calculating from each isolated pair of fault component voltage and current values a fault component operating voltage at the set point facilitates a determination of the nature of the fault, i.e. by way of a comparison with a historical measured voltage value, in a manner that is reliable and repeatable.

Moreover, the reliance solely on measured voltage and current values obtained at the first terminal and calculated fault component operating voltages based on such measured voltage and current values allows the DC distance protection controller of the invention to identify a fault within the protection zone without the need to rely on remote measurements from one or more other parts of a given DC electrical power network.

Such a controller therefore avoids the need for complex and unreliable communication links with the said remote parts of the DC electrical power network, as well as the need to compensate for the communication time delay associated with such remote communications.

In addition, the reliance of the controller on a comparison of a given calculated fault component operating voltage with an already measured, historical measured voltage value, allows the controller to provide ultra-high speed, i.e. within 1 millisecond, identification of a fault within the protection zone, thus allowing protective measures, e.g. the operation of an associated protection device, to also be carried out very quickly, i.e. within 5 milliseconds.

In an embodiment the controller is programmed to isolate a fault component voltage value and fault component current value in respect of each sampled pair of measured voltage and current values by applying a filter to the measured voltage value and the measured current value of each said sampled pair.

Such a step reliably and repeatably removes all other elements from each of the measured voltage and current values so as to leave only the required corresponding fault component voltage and current values.

Optionally the controller is programmed to compare the magnitudes of respective calculated fault component operating voltages and historical voltage values.

Such a comparison can be readily carried out by a controller in the form of, e.g. a programmable microcontroller or the like.

In a preferred embodiment of the invention the controller is programmed to compare a given calculated fault component operating voltage with a corresponding historical voltage value derived from a historical measured voltage value obtained a predetermined period of time before the time at which the sampled pair on which the said given fault component operating voltage is based was obtained.

In an embodiment the predetermined period of time is at least 5 milliseconds.

The foregoing features assist the protection controller in accurately identifying a fault within the protection zone by helping to ensure that the historical measured voltage value with which a given calculated fault component operating voltage is compared is untainted by a fault component which might otherwise adversely affect the outcome of such a comparison.

In a preferred embodiment of the invention the set point is spaced along the DC power transmission conduit from the first terminal by between 80% and 95% of the total length of the said transmission conduit.

Locating the set point along the DC power transmission conduit in the aforementioned manner defines a protection zone which provides protection for the vast majority of the DC power transmission conduit, i.e. up to 95% of the said transmission conduit.

The protection controller may be programmed to calculate a given fault component operating voltage from the corresponding isolated pair of fault component voltage and current values using one of the following models of the DC power transmission conduit:

a resistance-inductance model;
a distributed parameter line model; and
a frequency dependent distributed parameter line model.

Each of the foregoing models provides a desired degree of accuracy, in terms of the manner in which it approximates the performance characteristics of the DC power transmission conduit, according to the overall length of the said transmission conduit.

In another preferred embodiment of the invention the protection controller is additionally programmed to operate an associated protection device upon receipt of an external trip signal.

Such a configuration extends the functionality of the protection controller of the invention in circumstances where modest communication between, e.g. remote terminals in a DC electrical power network, is possible.

According to a second aspect of the invention there is provided a DC electrical power network comprising at least one DC distance protection controller according to any preceding claim.

Such a DC electrical power network shares the benefits associated with the or each DC distance protection controller included therein.

BRIEF DESCRIPTION OF THE DRAWINGS

There now follows a brief description of preferred embodiments of the invention, by way of non-limiting examples, with reference being made to the following drawings in which.

DETAILED DESCRIPTION

A DC distance protection controller according to a first embodiment of the invention is designated generally by reference numeral 10.

The first protection controller 10 is arranged to identify a fault within a protection zone 12 that extends between a first terminal 14 with which the first protection controller 10 is, in use, operatively associated, and a set point 16 along a DC power transmission conduit 18.

Figure 1:
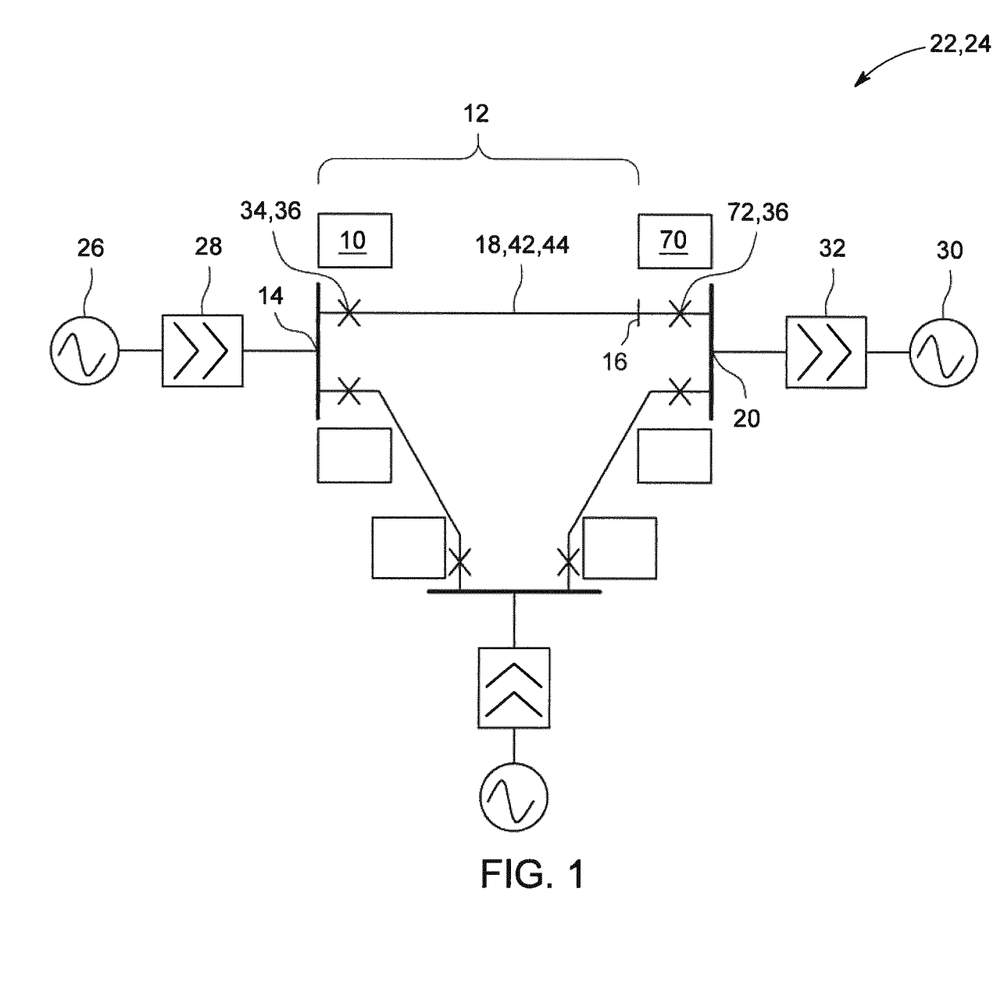
FIG. 1 shows a schematic view of a DC electrical power network including first and second DC distance protection controllers according to respective first and second embodiments of the invention.

The DC power transmission conduit 18 lies between the aforementioned first terminal 14 and a second terminal 20, with both the first and second terminals 14, 20 forming a part of a DC electrical power network 22 that has the form of a DC grid 24, as shown schematically in FIG. 1. The set point 16 is spaced from the first terminal 14 by between 80% and 95%, and 90% and 95%, of the total length of the first DC power transmission conduit 18, such that the set point 16 lies a distance $D_{set}$ from the first terminal 14. Meanwhile the first terminal 14 has a first AC network 26 connected thereto via a first power converter 28 while the second terminal 20 has a second AC network 30 connected thereto via a second power converter 32.

The first protection controller 10 is also operatively associated, in use, with a first protection device 34, which in the embodiment shown is a circuit breaker 36, although other types of protection device such as a relay are also possible. The first protection device 34, i.e. circuit breaker 36, is operable to protect the protection zone 12 within the first DC power transmission conduit 18, and more particularly is operable to isolate the protection zone 12 from the first terminal 14 and hence from the first AC network 26 connected thereto.

Figure 2:
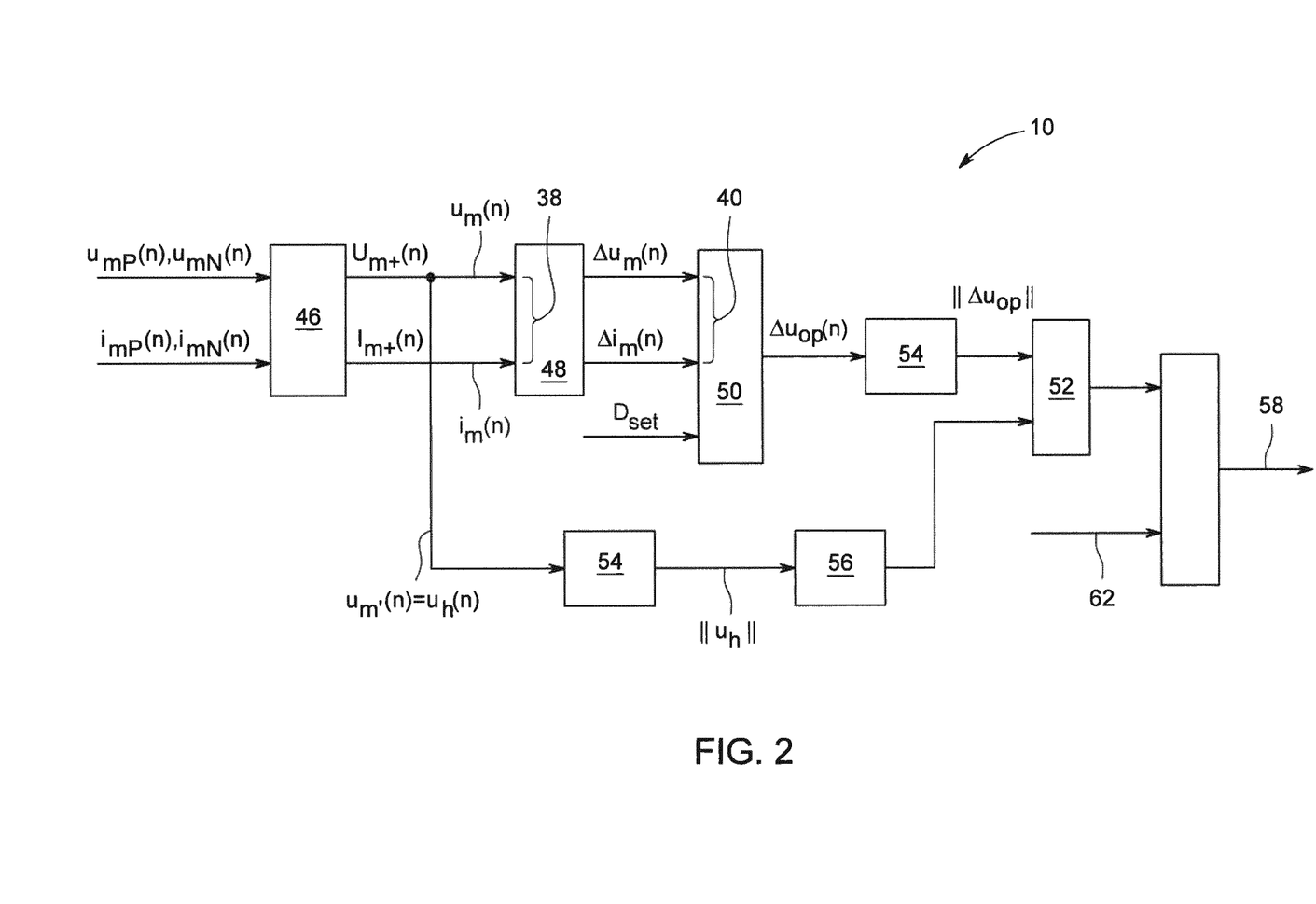
FIG. 2 shows a schematic representation of the first protection controller shown in FIG. 1.

With reference to FIG. 2, the first protection controller 10 is programmed to:

(i) periodically obtain as respective sampled pairs 38 a measured voltage value $u_m$ and a measured current value $i_m$ of the DC power transmission conduit 18 at the first terminal 14;

(ii) isolate in respect of each sampled pair 38, a fault component voltage value $\Delta u_m$ from the corresponding measured voltage value $u_m$ and a fault component current value $\Delta i_m$ from the corresponding measured current value $i_m$ to define a respective corresponding isolated pair 40;

(iii) calculate from each isolated pair 40 of fault component voltage and current values $\Delta u_m$, $\Delta i_m$ a fault component operating voltage $\Delta u_{op}$ of the DC power transmission conduit 18 at the set point 16 along the DC power transmission conduit 18;

(iv) compare a given calculated fault component operating voltage $\Delta u_{op}$ with a historical voltage value $u_h$ derived from a historical measured voltage value $u_m'$ from an earlier sampled pair 38 of measured voltage and current values $u_m$, $i_m$; and (v) identify a fault within the protection zone 12 when the given calculated fault component operating voltage $\Delta u_{op}$ is greater than the historical voltage value $u_h$ with which it is compared.

The first protection controller 10 periodically obtains measured voltage values $u_m$ and measured current values $i_m$ of the DC power transmission conduit 18 via a measurement apparatus (not shown) which is operatively associated with the first terminal 14 and is able selectively to measure the current and voltage of the DC power transmission conduit 18 at the said first terminal 14.

In the embodiment shown, the first DC power transmission conduit 18 is defined by a first transmission line 42, and more particularly by a first bi-polar transmission line 44, i.e. a transmission line incorporating two conductors (not shown) operating at different polarities. In other embodiments (not shown) the first DC power transmission conduit 18 may instead be defined by a first underground transmission cable which may or may not be bi-polar and could be mono-polar, i.e. could incorporate a single conductor operating at a single polarity. The first DC power transmission conduit 18 could also be defined by a mono-polar transmission line.

With respect to the first bi-polar transmission line 44, the measurement apparatus periodically takes measured samples of a positive-pole voltage $u_{mP}$ of a first conductor of the bi-polar transmission line 44 operating at a positive polarity and measured samples of a negative-pole voltage $u_{mN}$ of a second conductor of the bi-polar transmission line 44 operating at a negative polarity. Each such measured sample is taken with respect to ground in each instance and at a respective busbar of a double busbar (not shown) which defines the first terminal 14.

Meanwhile the measurement apparatus similarly periodically takes measured samples, at the first terminal 14, of a positive-pole current $i_{mP}$ flowing in the first conductor between the first and second terminals 14, 20 and of a negative-pole current $i_{mN}$ flowing in the second conductor between the first and second terminals 14, 20.

The sampling period Ts adopted by the measurement apparatus may, by way of example, be given by:

Ts=1/96000 seconds

Since such positive and negative samples are taken it is necessary thereafter, in the embodiment shown, for the first protection controller 10 to additionally calculate an equivalent to a directly measured voltage value $u_m$ in the form of a positive-mode (which may also be known as an 'aerial' mode) voltage value $u_{m+}$, and also an equivalent to a directly measured current value $i_m$ in the form of a positive-mode current value $i_{m+}$ according to the following phase-mode transformation:

$$\begin{cases} u_{m+}(n) = u_{mP}(n) - u_{mN}(n) \\ i_{m+}(n) = i_{mP}(n) - i_{mN}(n) \end{cases}$$

where, $u_{mP}$ is the measured voltage of the positive polar conduit;
$u_{mN}$ is the measured voltage of the negative polar conduit;
$i_{mP}$ is the measured current of the positive polar conduit; and
$i_{mN}$ is the measured current of the negative polar conduit.

In order to carry out the aforementioned phase-mode transformation the first protection controller 10 includes a phase-mode transformation block 46, as shown in FIG. 2.

In embodiments of the invention operatively associated with a DC power transmission conduit 18 that is defined by a mono-polar transmission line or cable, the first protection controller 10 need not be programmed to carry out the aforementioned phase-mode transformation, and is able to make use instead of measured voltage and current values $u_m$, $i_m$ obtained directly from the measurement apparatus. Accordingly the first protection controller 10 in such embodiments may omit the phase-mode transformation block 46 mentioned above.

Accordingly, the first protection controller 10 obtains respective sampled pairs 38 of measured voltage and current values $u_m$, $i_m$, i.e. equivalent positive-mode voltage and current values $u_{m+}$, $i_{m+}$.

Thereafter the first protection controller 10 isolates in respect of each sampled pair 38 of measured voltage and current values $u_m$, $i_m$ respective voltage and current fault components. More particularly, the protection controller 10 isolates a fault component voltage value $\Delta u_m$ from each corresponding measured voltage value $u_m$ and isolates a fault component current value $\Delta i_m$ from each corresponding measured current value $i_m$, and thereby defines respective corresponding isolated pairs 40 of fault component voltage and current values $\Delta u_m$, $\Delta i_m$.

The protection controller 10 is programmed to carry out such isolation by applying a filter, and more particularly a high pass filter, and to that end the protection controller 10 includes a filter block 48. The filter block 48 produces the aforementioned respective isolated pairs 40 of fault component voltage and current values $\Delta u_m$, $\Delta i_m$ according to the following:

$$\begin{cases} \Delta u_m(n) = u_m(n) - u_m(n-M) \\ \Delta i_m(n) = i_m(n) - i_m(n-M) \end{cases}$$

where,

M is the number of samples in the chosen window which is determined by the length of the chosen window over which samples are obtained.

By way of example the window may be 5 milliseconds, such that:

M=5 ms/Ts where,

Ts is the sampling period, e.g. 1/96000 seconds whereby

M=0.005*96000

M=480

Different sampling periods and/or window lengths may, however, be used.

The first protection controller 10 is then programmed to calculate from each isolated pair 40 of fault component voltage and current values $\Delta u_m$, $\Delta i_m$ a fault component operating voltage $\Delta u_{op}$ of the DC power transmission conduit 18 at the set point 16 therealong.

The protection controller 10 is so programmed to calculate the respective fault component operating voltages $\Delta u_{op}$ using a resistance-inductance model of the DC power transmission conduit 18. Such a model is particularly suitable, i.e. provides a desired degree of accuracy, if the first bi-polar transmission line 44 is relatively short, e.g. less than approximately 100 km (or less than approximately 30 km if the DC power transmission conduit 18 is instead defined by an underground transmission cable).

The first protection controller 10 includes a fault component operating voltage calculation block 50 which handles the calculation of each of the various fault component operating voltages $\Delta u_{op}$, from the corresponding isolated pair 40 of fault component voltage and current values $\Delta u_m$, $\Delta i_m$, based on the differential equation, $$\Delta u_{op}(t) = \Delta u_m(t) - R_{set} \Delta i_m(t) - L_{set} \frac{d\Delta i_m(t)}{dt}$$

which can be implemented by:

$$\Delta u_{op}(n) = \frac{[\Delta u_m(n) + \Delta u_m(n-1)]}{2} - R_{set} \frac{[\Delta i_m(n) + \Delta i_m(n-1)]}{2} - L_{set} \frac{[\Delta i_m(n) - \Delta i_m(n-1)]}{T_s}$$

where, $R_{set}$ is the resistance of the section of DC power transmission conduit 18 from the first terminal 14 to the set point 16 along the DC power transmission conduit 18; and $L_{set}$ is the inductance of the section of DC power transmission conduit 18 from the first terminal 14 to the set point 16 along the DC power transmission conduit 18.

Each of the resistance and inductance values $R_{set}$, $L_{set}$ mentioned above can be established from technical data on the DC power transmission conduit 18, e.g. as provided by the operator of the DC electrical power network 22, and the known distance $D_{set}$ of the set point 16 from the first terminal 14.

In other embodiments of the invention (not shown) the first protection controller 10 may instead be programmed to calculate respective fault component operating voltages $\Delta u_{op}$ at the set point 16 along the DC power transmission conduit 18 by using either a distributed parameter line model of the DC power transmission conduit 18 or a frequency dependent distributed parameter line model of the DC power transmission conduit 18.

In embodiments in which the protection controller 10 is programmed to calculate respective fault component operating voltages $\Delta u_{op}$ using a distributed parameter line model of the DC power transmission conduit 18, it is assumed that the parameters of the frequencies are the same as those of one representative frequency, e.g. 50 Hz, or 100 Hz, such that $$\Delta u_{op}(t-T_p)=[K_p\Delta f_m(t-2T_p)+\Delta b_m(t)/K_p]/2$$

where, $\Delta f_m$ is the forward voltage travelling wave at the location of the first protection device 34, i.e. at the first terminal 14; and $\Delta b_m$ is the backward voltage travelling wave at the location of the first protection device 34, i.e. at the first terminal 14 with $\Delta f_m$ and $\Delta b_m$ being given by:

$$\begin{cases} \Delta f_m(t) = \Delta u_m(t) + Z_c\Delta i_m(t-T_z) \\ \Delta b_m(t) = \Delta u_m(t) - Z_c\Delta i_m(t-T_z) \end{cases}$$

where, $Z_c=|\sqrt{z/y}|$ is the surge impedance, which is calculated by the impedance z (ohm/km) and admittance y (S/km) per unit of the first bi-polar transmission line 44;

$$T_z = \text{phase}\left(\sqrt{\frac{z}{y}}\right)/\omega_0,$$

where $\omega_0$ is the representative frequency, i.e. the frequency at which the DC electrical power network 22 is operating;

$T_p=\text{imag}(D_{set}\sqrt{zy})/\omega_0$ is the propagation time from where the first protection device 34 is located, i.e. the first terminal 14, to the set point 16 along the DC power transmission conduit 18 with $D_{set}$ being the equivalent distance in km of the set point 16 from the first terminal 14; and $K_p=\exp(-\text{real}(D_{set}\sqrt{zy}))$ is the decaying factor from where the first protection device 34 is located, i.e. the first terminal 14, to the set point 16 along the DC power transmission conduit 18.

The performance values mentioned above can again be established from technical data provided by the operator of the DC electrical power network 22, and the known distance $D_{set}$ of the set point 16 from the first terminal 14.

As an alternative if the first transmission line 42, i.e. the first bi-polar transmission line 44, is not in distortion, the main equations set out above may again be utilized but the following parameters may instead be calculated:

$Z_c=\sqrt{L/C}$ is the surge impedance, with L being the inductance (H/km) and C being the capacitance (F/km) per unit length of the first transmission line 42;

$T_z=0$, i.e. the phase shift of the surge impedance is neglected;

$T_p=D_{set}/(1/\sqrt{LC})$, is the propagation time from where the first protection device 34 is located, i.e. the first terminal 14, to the set point 16 along the DC power transmission conduit 18; and $K_p=\exp(-RD_{set}/Z_c)$, is the decaying factor from where the first protection device 34 is located, i.e. the first terminal 14, to the set point 16 along the DC power transmission conduit 18, with R being the resistance per unit length (ohm/km) of the first transmission line 42.

Similarly these performance values can again be established from technical data provided by the operator of the DC electrical power network 22, and the known distance $D_{set}$ of the set point 16 from the first terminal 14.

In any event, having the first protection controller 10 programmed to calculate respective fault component operating voltages $\Delta u_{op}$ using a distributed parameter line model of the DC power transmission conduit 18 is helpful for a longer transmission line 42, i.e. a line between approximately 100 km and 200 km, (or between approximately 30 km and 80 km if the DC power transmission conduit 18 is defined by an underground cable), since it is able to take account of any propagation time delay of a voltage waveform travelling within the line.

In further embodiments, in which the first protection controller 10 is programmed to calculate respective fault component operating voltages $\Delta u_{op}$ using a frequency distributed parameter line model of the DC power transmission conduit 18, the protection controller 10 first of all calculates a forward traveling wave $\Delta f_m(t)$ and a backward traveling wave $\Delta b_m(t)$ according to the following equations:

$$\Delta f_m(t)=\Delta u_m(t)+Z_c(t)*\Delta i_m(t)$$

$$\Delta b_m(t)=\Delta u_m(t)-Z_c(t)*\Delta i_m(t)$$

where, $Z_c(t)$ is the surge impedance which is frequency-dependent, and which can be described in the frequency domain by $$Z_c(z) = Z_{c0}\frac{1+a_1z^{-1}+\ldots+a_Nz^{-N}}{1+b_1z^{-1}+\ldots+b_Nz^{-N}}$$

with $Z_{c0}$ being the constant part of the surge impedance; and $a_k$ and $b_k$ being coefficients of the surge impedance in frequency domain $Z_c(z)$ The aforesaid $a_k$ and $b_k$ coefficients can be calculated by Carlson's equation from technical data on the DC power transmission conduit 18, e.g. as provided by the operator of the DC electrical power network 22.

Meanwhile the symbol * represents the mathematical operation of convolution, wherein it can be assumed that the surge impedance $z_c$ has 3 orders.

The protection controller 10 then secondly calculates the forward and backward traveling waves $f_{op}$, $b_{op}$ at the set point 16 according to:

$$f_{op}(t-T_{pSet})=f_m(t-2T_{pSet})*h_{set}(t)$$

$$b_{op}(t-T_{pSet})=b_m(t)*h_{set}^{-1}(t)$$

where, $T_{pSet}$ is the minimum propagation time from where the first protection device 34 is located, i.e. the first terminal 14, to the set point 16 along the DC power transmission conduit 18;

$h_{set}(t)$ is the propagation function for a traveling wave from where the first protection device 34 is located, i.e. from the first terminal 14, to the to the set point 16 along the DC power transmission conduit 18, which can be described in the frequency domain by $$H_{set}(z) = \frac{c_0 + c_1 z^{-1} + \ldots + c_{N-1} z^{-(N-1)}}{1 + d_1 z^{-1} + \ldots + d_N z^{-N}}$$

with, $c_k$ and $d_k$ being coefficients of the propagation function $H_{set}(z)$.

The foregoing $c_k$ and $d_k$ coefficients can again be calculated by Carlson's equation from technical data provided by the operator of the DC electrical power network 22.

Finally the protection controller 10 calculates the respective fault component operating voltages $\Delta u_{op}$ according to:

$$\Delta u_{op} = \Delta f_{op} + \Delta b_{op}$$

Having a first protection controller 10 programmed to calculate respective fault component operating voltages $\Delta u_{op}$ using a frequency dependent distributed parameter line model of the DC power transmission conduit 18 is helpful for extra-long transmission lines 42, i.e. a line more than approximately 200 km long (or more than 80 km long if the DC power transmission conduit 18 is defined by an underground cable), since it is able to take into account frequency-dependent parameters (such as, for example, the skin effect) which distort to a considerable extent the waveform of traveling waves in transmission lines of such length.

Meanwhile, returning to the embodiment shown, the protection controller 10 is programmed to compare a given calculated fault component operating voltage $\Delta u_{op}$, and more particularly each calculated fault component operating voltage $\Delta u_{op}$, with a historical voltage value $u_h$ that is derived from a historical measured voltage value $u_m{'}$ from an earlier sampled pair 38 of measured voltage and current values $u_m$, $i_m$.

In the embodiment shown the historical voltage value $u_h$ is identical to, and thereby derived directly from, the said historical measured voltage value $u_m$, i.e. an earlier measured voltage value $u_m{'}$ obtained at the first terminal 14.

In other embodiments of the invention, the historical voltage value $u_h$ may instead be given by a historical calculated voltage value which has been calculated for some other point along the DC power transmission conduit 18. In such circumstances the historical calculated voltage value is calculated from, i.e. derived from, corresponding historical measured voltage and current values obtained (as an earlier sampled pair (38)) at the first terminal 14.

The protection controller 10 includes a comparison block 52 that is programmed to compare the magnitude of a given fault component operating voltage $\Delta u_{op}$ with the magnitude of the said historical voltage $u_h$.

In the embodiment shown the protection controller 10 calculates each such magnitude $\| \ \|$ using a magnitude calculation block 54 which determines a root mean square (RMS) value $\|\Delta u_{op}\|$, $\|u_h\|$ from each of the corresponding fault component operating voltage $\Delta u_{op}$ and the historical voltage value $u_h$ according to:

$$\|x(n)\| = \sqrt{\frac{1}{W} \sum_{k=0}^{W-1} |x(n-k)|^2}$$

with,

W being the number of samples in the sample set, e.g. 48, i.e. as obtained by setting a window length of 0.5 milliseconds (to help ensure a fast response by the protection controller 10) with a sampling period of 1/96000 seconds.

In other embodiments of the invention the magnitude calculation block 54 may instead determine a magnitude $\| \ \|$ in the form of a sum of the absolute value, i.e. as given by:

$$\|x(n)\| = \frac{1}{W} \sum_{k=0}^{W-1} |x(n-k)|$$

where,

W is again the number of samples in the sample set.

In either case, the protection controller 10 is programmed to compare the magnitude of a given calculated fault component operating voltage $\|\Delta u_{op}\|$ with the magnitude of a corresponding historical voltage value $\|u_h\|$ derived from, i.e. identical to, a historical measured voltage value $u_m{'}$ which was obtained, i.e. measured, a predetermined period of time before the time at which the sampled pair 38 of measured voltage and current values $u_m$, $i_m$ from which the said magnitude of a given calculated fault component operating voltage $\|\Delta u_{op}\|$ is derived were obtained, i.e. measured.

The predetermined period of time is at least 5 milliseconds and is, in the embodiment shown, 10 milliseconds. The predetermined period may be less than or more than 10 milliseconds.

In any event, a practical way of ensuring that the historical measured voltage value $u_m{'}$ from which the historical voltage value $u_h$ is derived was obtained 10 milliseconds before the voltage and current values $u_m$, $i_m$ from which the fault component operating voltage $\Delta u_{op}$ it is to be compared with was obtained, is to introduce a delay in the utilisation of the historical voltage value $u_h$. The protection controller 10 achieves this by including a delay block 56 which holds up further use of the magnitude of the historical voltage value $\|u_h\|$ by the desired 10 milliseconds.

When the magnitude of the calculated fault component operating voltage $\|\Delta u_{op}\|$ is greater than the magnitude of the corresponding historical voltage value $\|u_h\|$, the first protection controller 10 identifies that there is a fault within the protection zone 12.

Figure 3A:
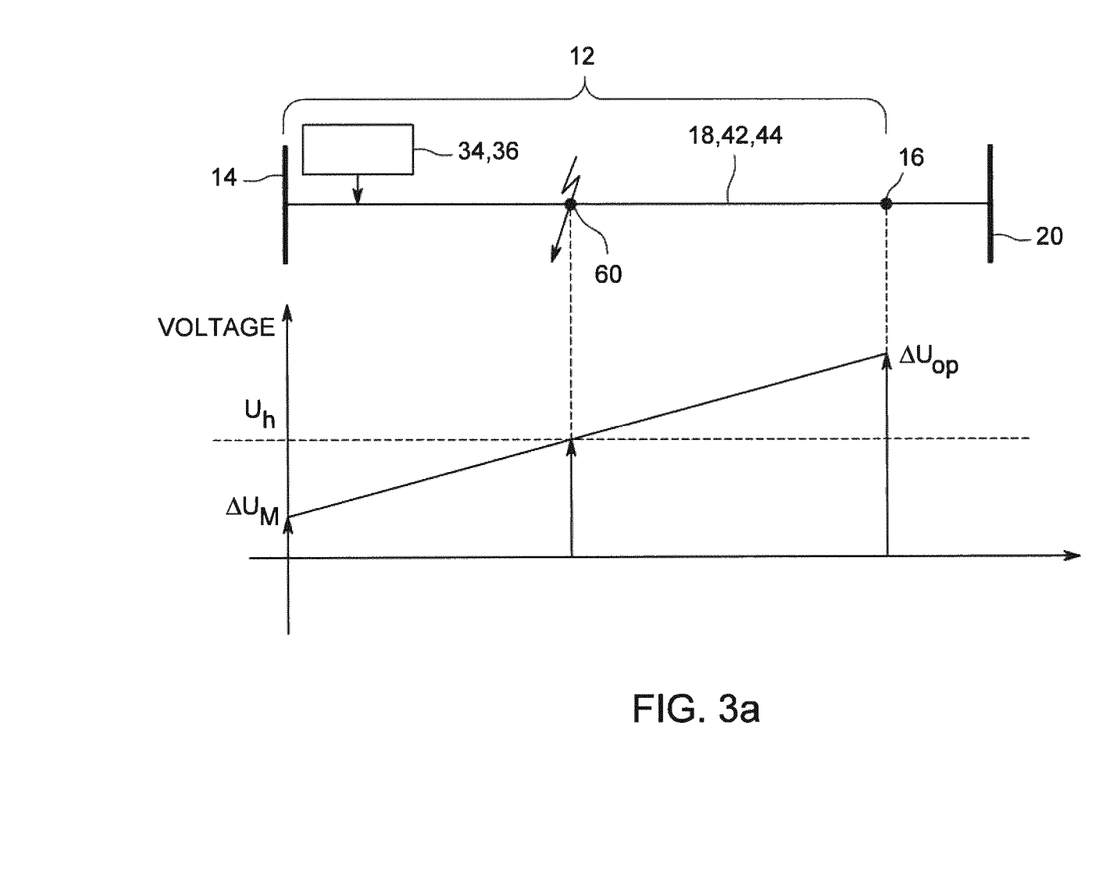
FIG. 3(A) illustrates schematically operation of the first protection controller in the event of a first fault within a protection zone covered by the first protection controller.

Such operation of the first protection controller 10 in the event of a first fault 60 arising within the protection zone 12 covered by the protection controller 10 is illustrated schematically in FIG. 3(A).

More particularly, before the first fault 60 arises the measured voltage value at the first terminal 14 remains equal to a normal operating voltage of the associated DC power transmission conduit 18 such that, in turn, respective historical measured voltage values $u_m{'}$ similarly remain equal to the normal operating voltage. Hence respective historical voltage values $u_h$, being derived directly from the historical measured voltage values $u_m{'}$, also remain equal to the normal operating voltage. There are no fault components in the measured voltage and current values obtained during this pre-fault period and so the magnitude of the calculated fault component operating voltage $\|\Delta u_{op}\|$ at the set point 16 is zero.

Accordingly, the magnitude of a given historical voltage value $\|u_h\|$, i.e. the magnitude of the normal expected operating voltage of the DC power transmission conduit 18, is greater than the magnitude of the corresponding calculated fault component operating voltage $\|\Delta u_{op}\|$, and so the protection controller 10 provides no indication that a fault has arisen.

When the first fault 60 arises a fault component appears in each of the measured voltage value $u_m$ and the measured current value $i_m$ at the first terminal 14, such that an isolated pair 40 of fault component voltage and current values $\Delta u_m$, $\Delta i_m$ is output by the filter block 48 of the protection controller 10. Such an isolated pair 40 gives rise to a calculated fault component operating voltage $\Delta u_{op}$ which, as shown in FIG. 3(A), has a magnitude that is greater than the magnitude of the corresponding historical voltage value $u_h$, i.e. the normal operating voltage of the DC transmission conduit 18 as measured 10 milliseconds earlier. Consequently the protection controller 10 is able to identify that the first fault 62 has arisen within the protection zone 12.

Thereafter the protection controller 10 operates the first protection device 34, e.g. by issuing a trip command 58, to protect, i.e. isolate, the protection zone 12 from the first AC network 26.

Figure 3B:
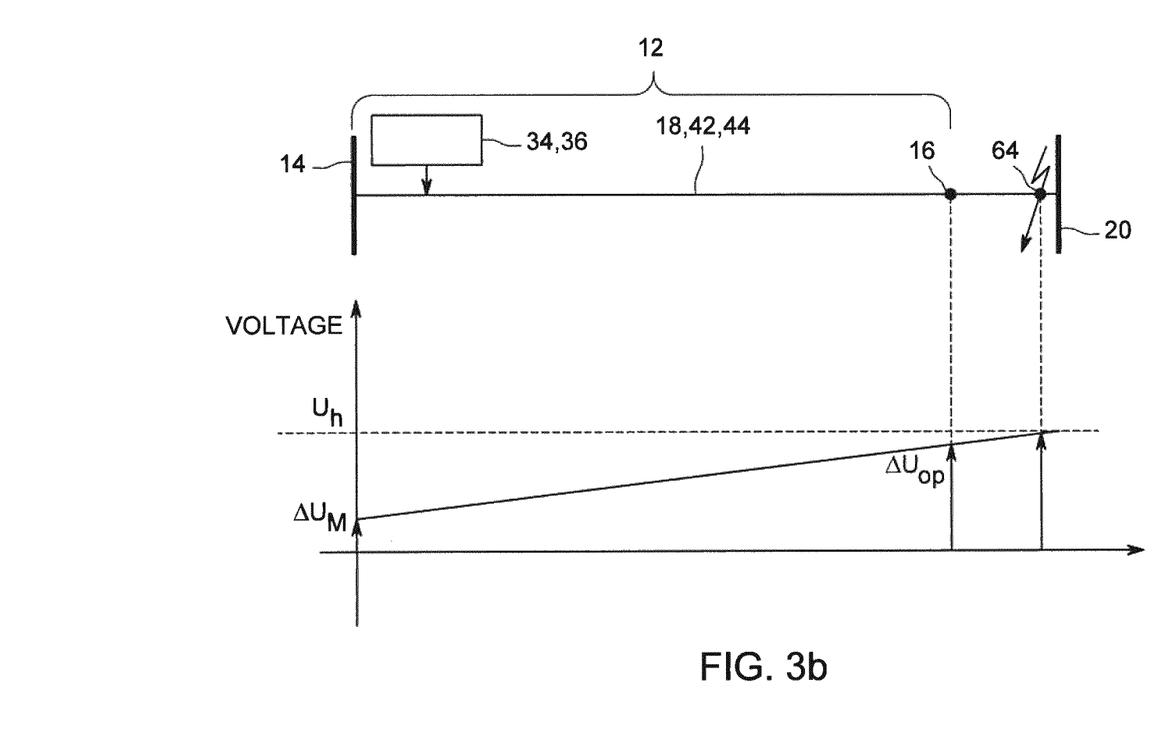
FIG. 3(B) illustrates schematically operation of the first protection controller in the event of a second fault outside the protection zone covered by the first protection controller.

Operation of the first protection controller 10 when a second fault 64 arises in the DC power transmission conduit 18 at a point which lies outside the protection zone 12, is illustrated schematically in FIG. 3(b).

Again, before the first fault 60 arises the measured voltage value at the first terminal 14 remains equal to a normal operating voltage of the associated DC power transmission conduit 18 such that respective historical voltage values $u_h$ similarly remain equal to the normal operating voltage. There are no fault components in the measured voltage and current values, and so the magnitude of the calculated fault component operating voltage $\|\Delta u_{op}\|$ at the set point 16 is zero, such that the protection controller 10 does not indicate that a fault has arisen.

When the second fault 64 arises outside the protection zone 12 a fault component nevertheless appears in each of the measured voltage value $u_m$ and the measured current value $i_m$ at the first terminal 14, such that an isolated pair 40 of fault component voltage and current values $\Delta u_m$, $\Delta i_m$ is again output by the filter block 48 of the protection controller 10. The calculated fault component operating voltage $\Delta u_{op}$ derived from the aforementioned isolated pair 40 does, however, have a magnitude that is less than the magnitude of the corresponding historical voltage value $u_h$, i.e. the normal operating voltage of the DC transmission conduit 18 as measured 10 milliseconds earlier, as shown in FIG. 3(b). Consequently the protection controller 10 is able to discern that the second fault 64 has arisen outside the protection zone 12, and hence makes no indication that a fault has arisen.

In addition to the foregoing, the first protection controller 10 operates the first protection device 34 upon receipt of an external trip signal 62, e.g. from a second protection controller 70 which is operatively associated with the second terminal 20 at the other end of the first DC power transmission conduit 18. The second protection controller 70 is very similar to the first protection controller 10 and is programmed to operate in essentially the same manner with respect to a further set point (not shown) similarly spaced from the second terminal 20 to define a second protection zone which overlaps with the first protection zone 12.

The second protection controller 70 is additionally arranged to operate a second protection device 72 in the form of a further circuit breaker 36 to isolate the second protection zone from the second terminal 20 and the second AC network 30 connected therewith. The first and second protection controllers 10; 70 and associated first and second protection devices 34; 72 therefore together provide overlapping protection for the first DC power transmission conduit 18.

The invention claimed is:

1. A DC distance protection controller, for identifying a fault within a protection zone extending between a first terminal with which the protection controller is in use operatively associated and a set point along a DC power transmission conduit lying between the first terminal and a second terminal within a DC electrical power network, the protection controller being programmed to:
   (i) periodically obtain as respective sampled pairs a measured voltage value and a measured current value of the DC power transmission conduit at the first terminal;
   (ii) isolate in respect of each sampled pair, a fault component voltage value from the corresponding measured voltage value and a fault component current value from the corresponding measured current value to define a respective corresponding isolated pair;
   (iii) calculate from each isolated pair of fault component voltage and current values a fault component operating voltage of the DC power transmission conduit at the set point along the DC power transmission conduit;
   (iv) compare a given calculated fault component operating voltage with a historical voltage value derived from a historical measured voltage value from an earlier sampled pair of measured voltage and current values; and
   (v) identify a fault within the protection zone when the given calculated fault component operating voltage is greater than the historical voltage value with which it is compared, and
   (vi) identify a distance value from the first terminal to a location associated with the identified fault, based on a relationship between the fault component voltage value and the calculated fault component operating voltage, wherein the protection controller includes a phase-mode transformation block configured to calculate the measured voltage value in the form of a positive-mode voltage value based on the positive measured samples and negative measured samples for the DC power transmission conduit, and to calculate the measured current value in the form of a positive-mode current value based on positive current measured samples and negative current measured samples for the DC power transmission conduit.

2. The DC distance protection controller according to claim 1, programmed to isolate a fault component voltage value and a fault component current value in respect of each sampled pair of measured voltage and current values by applying a filter to the measured voltage value and the measured current value of each said sampled pair.

3. The DC distance protection controller according claim 1, programmed to compare the magnitudes of respective calculated fault component operating voltages and historical voltage values.

4. The DC distance protection controller according to claim 1, programmed to compare a given calculated fault component operating voltage with a corresponding historical voltage value derived from a historical measured voltage value obtained a predetermined period of time before the time at which the sampled pair on which the said given fault component operating voltage is based was obtained.

5. The DC distance protection controller according to claim 4, wherein the predetermined period of time is at least 5 milliseconds.

6. The DC distance protection controller according claim 1, wherein the set point is spaced along the DC power transmission conduit from the first terminal by between 80% and 95% of the total length of the said transmission conduit.

7. The DC distance protection controller according to claim 1, programmed to calculate a given fault component operating voltage from the corresponding isolated pair of fault component voltage and current values using one of the following models of the DC power transmission conduit:

a resistance-inductance model;

a distributed parameter line model; and a frequency dependent distributed parameter line model.

8. The DC distance protection controller according to claim 1, additionally programmed to operate an associated protection device upon receipt of an external trip signal.

9. A DC electrical power network comprising at least one DC distance protection controller according to claim 1.

* * * * *